US008710558B2

(12) United States Patent
Inoue et al.

(10) Patent No.: US 8,710,558 B2
(45) Date of Patent: Apr. 29, 2014

(54) PHOTOELECTRIC CONVERSION APPARATUS

(75) Inventors: Daisuke Inoue, Ebina (JP); Tetsunobu Kochi, Hiratsuka (JP); Yukihiro Kuroda, Kunitachi (JP); Hideo Kobayashi, Tokyo (JP); Kouji Maeda, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 253 days.

(21) Appl. No.: 13/353,546

(22) Filed: Jan. 19, 2012

(65) Prior Publication Data
US 2012/0193690 A1 Aug. 2, 2012

(30) Foreign Application Priority Data

Jan. 31, 2011 (JP) ................................. 2011-018793
Nov. 17, 2011 (JP) ................................. 2011-251657

(51) Int. Cl.
*H01L 31/062* (2012.01)
(52) U.S. Cl.
USPC .................... 257/290; 257/293; 257/E27.129
(58) Field of Classification Search
CPC .................. H01L 27/14665; H01L 27/14609; H01L 27/14643
USPC .................... 257/290–293, 232, 462, E27.129
See application file for complete search history.

(56) References Cited

U.S. PATENT DOCUMENTS

| | | | |
|---|---|---|---|
| 6,188,094 B1 | 2/2001 | Kochi et al. | |
| 6,605,850 B1 | 8/2003 | Kochi et al. | |
| 6,670,990 B1 | 12/2003 | Kochi et al. | |
| 6,717,151 B2 | 4/2004 | Tashiro et al. | |
| 6,800,836 B2 | 10/2004 | Hamamoto et al. | |
| 6,946,637 B2 | 9/2005 | Kochi et al. | |
| 7,016,089 B2 | 3/2006 | Yoneda et al. | |
| 7,110,030 B1 | 9/2006 | Kochi et al. | |
| 7,129,458 B2 | 10/2006 | Hamamoto et al. | |
| 7,135,668 B2 | 11/2006 | Kochi et al. | |
| 7,221,397 B1 | 5/2007 | Kochi | |
| 7,335,869 B2 | 2/2008 | Kochi | |
| 7,423,790 B2 | 9/2008 | Kochi et al. | |
| 7,473,882 B2 | 1/2009 | Kochi | |
| 7,566,857 B2 | 7/2009 | Kochi | |
| 7,592,575 B2 | 9/2009 | Kochi | |
| 7,616,355 B2 | 11/2009 | Yoneda et al. | |
| 7,709,869 B2 | 5/2010 | Kuroda | |
| 7,816,755 B2 | 10/2010 | Yamazaki et al. | |
| 7,864,384 B2 | 1/2011 | Yoneda et al. | |
| 7,889,254 B2 | 2/2011 | Kochi et al. | |
| 7,911,521 B2 | 3/2011 | Kuroda et al. | |

(Continued)

FOREIGN PATENT DOCUMENTS

JP    2001-326378 A    11/2001

*Primary Examiner* — Jack Chen
(74) *Attorney, Agent, or Firm* — Fitzpatrick, Cella, Harper & Scinto

(57) ABSTRACT

There is provided a photoelectric conversion apparatus which is characterized by comprising a plurality of photoelectric conversion regions of a first conductivity type, and a plurality of semiconductor regions of a second conductivity type opposite to the first conductivity type; and in that the plurality of photoelectric conversion regions of the first conductivity type and the plurality of semiconductor regions are alternately arranged, and a voltage controlling unit is further provided to change a width of a depletion layer formed in a semiconductor substrate by controlling a voltage to be applied to the semiconductor region of the second conductivity type provided between the plurality of photoelectric conversion regions of the first conductivity type.

16 Claims, 9 Drawing Sheets

(56) References Cited

U.S. PATENT DOCUMENTS

| | | |
|---|---|---|
| 7,935,995 B2 | 5/2011 | Watanabe et al. |
| 7,936,487 B2 | 5/2011 | Yoneda et al. |
| 7,990,440 B2 | 8/2011 | Kobayashi et al. |
| 8,026,469 B2 | 9/2011 | Kochi |
| 8,159,582 B2 | 4/2012 | Kato et al. |
| 8,174,599 B2 | 5/2012 | Kuroda et al. |
| 2010/0079648 A1 | 4/2010 | Totsuka et al. |
| 2010/0134664 A1 | 6/2010 | Kuroda et al. |
| 2010/0194946 A1 | 8/2010 | Shinohara et al. |
| 2010/0201856 A1 | 8/2010 | Hayashi et al. |
| 2011/0134296 A1 | 6/2011 | Kuroda et al. |
| 2011/0157440 A1 | 6/2011 | Yoneda et al. |
| 2011/0175151 A1 | 7/2011 | Watanabe et al. |
| 2011/0278438 A1 | 11/2011 | Kobayashi |
| 2012/0175503 A1 | 7/2012 | Kuroda et al. |
| 2012/0193690 A1* | 8/2012 | Inoue et al. .................. 257/290 |

\* cited by examiner

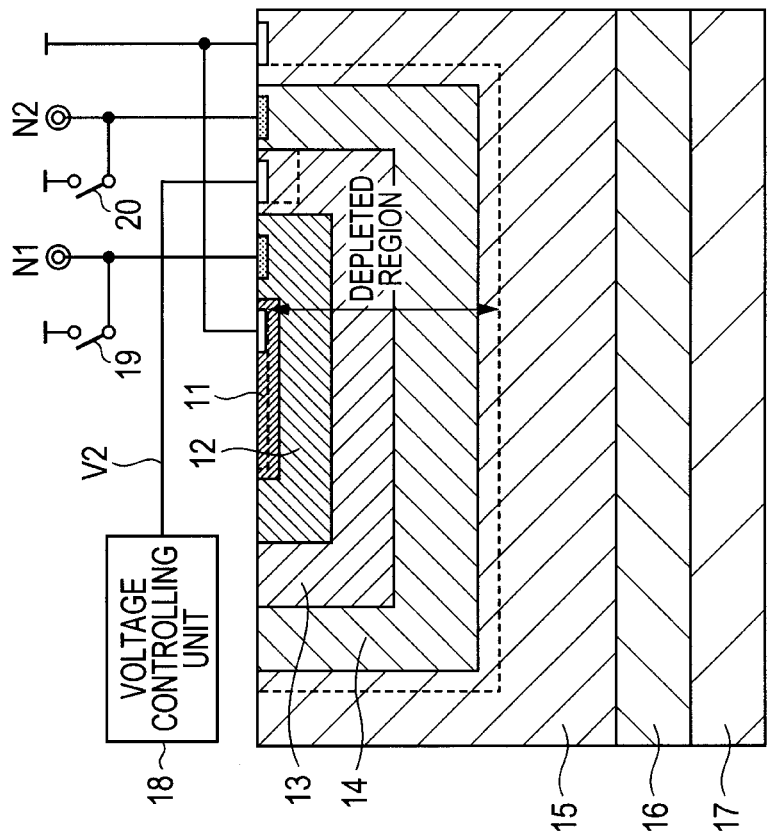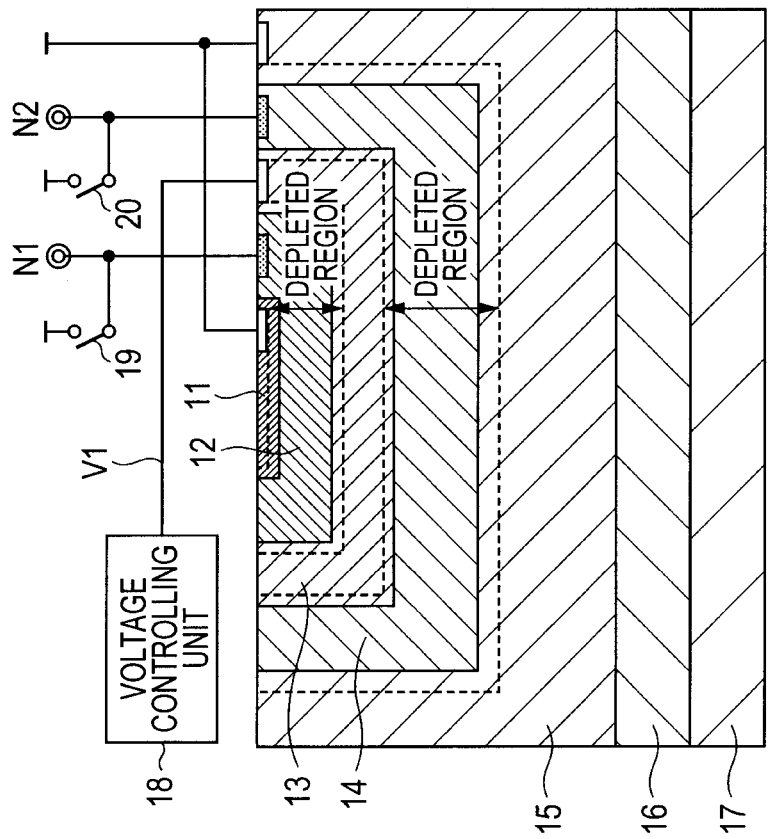

US 8,710,558 B2

PHOTOELECTRIC CONVERSION APPARATUS

BACKGROUND OF THE INVENTION

1. Field of the Invention

The present invention relates to a photoelectric conversion apparatus.

2. Description of the Related Art

In a light receiving sensor in which a photodiode has been constituted by forming a PN junction portion on a semiconductor substrate, a spectral region on which light can be received is determined according to a depth distance from the surface of the semiconductor substrate to the PN junction portion. In Japanese Patent Application Laid-Open No. 2001-326378, the size of a region on which carriers generated in a semiconductor layer of a first conductivity type can be detected is changed by changing the magnitude of a voltage to be applied to a semiconductor layer of a first conductivity type and a semiconductor substrate, thereby controlling sensitivity for the wavelength of incident light. Thus, it is possible to select either visible light or infrared light and then receive the selected light.

However, in such a case, there is a problem that a mixture of colors occurs since color separation is difficult in a spectral characteristic determined according to the depth distance from the surface of the semiconductor. On the other hand, in the photodiode in which the PN junction portions are made multilayered and separated up and down to improve color separation performance, there is a problem that optical signals under low luminance circumstances cannot sufficiently be obtained since photocarriers generated in an intermediate layer formed for a separation layer are discarded.

SUMMARY OF THE INVENTION

The present invention aims to provide a photoelectric conversion apparatus which can reduce a mixture of colors in a spectral characteristic determined according to a depth distance from the surface of a semiconductor substrate in a laminated photodiode, and can improve sensitivity by detecting spectral characteristics of three or more colors.

A photoelectric conversion apparatus according to the present invention is characterized by comprising: a plurality of photoelectric conversion regions of a first conductivity type; and a plurality of semiconductor regions of a second conductivity type opposite to the first conductivity type, wherein the plurality of photoelectric conversion regions of the first conductivity type and the plurality of semiconductor regions are alternately arranged, and the photoelectric conversion apparatus further comprises a voltage controlling unit configured to change a width of a depletion layer formed in a semiconductor substrate, by controlling a voltage to be applied to the semiconductor region of the second conductivity type provided between the plurality of photoelectric conversion regions of the first conductivity type.

Further features of the present invention will become apparent from the following description of exemplary embodiments with reference to the attached drawings.

BRIEF DESCRIPTION OF THE DRAWINGS

FIGS. 1A and 1B are cross-section structure diagrams of a photoelectric conversion apparatus according to a first embodiment of the present invention.

DESCRIPTION OF THE EMBODIMENTS

First Embodiment

Figure 2A:
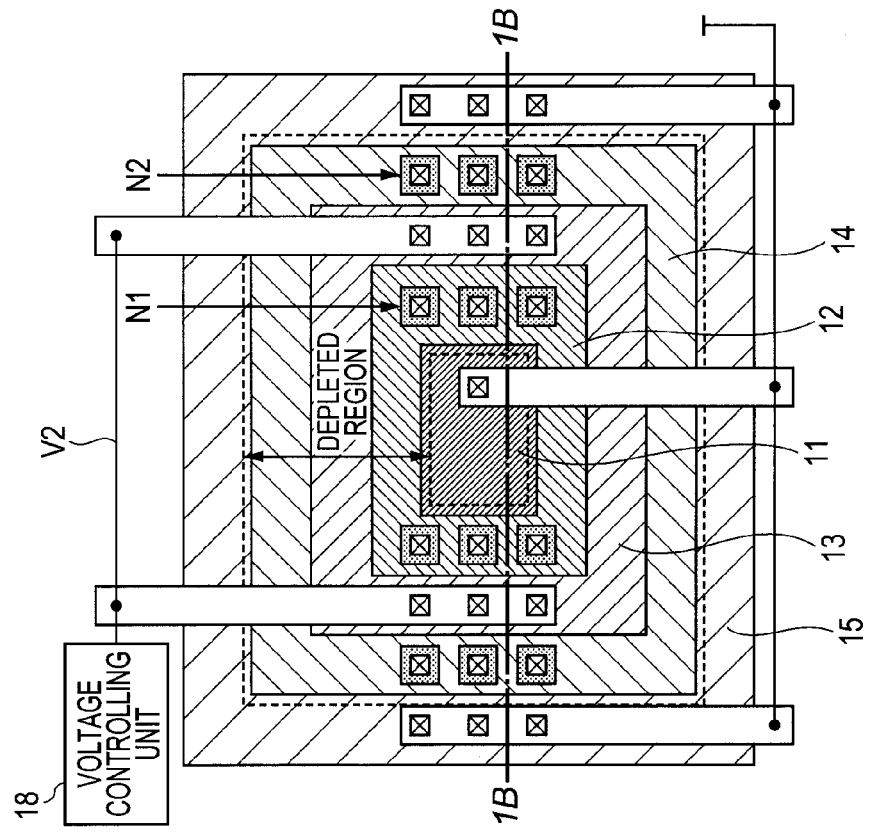
FIGS. 2A and 2B are planar structure diagrams of the photoelectric conversion apparatus according to the first embodiment of the present invention.

FIGS. 1A and 1B are cross-section structure diagrams of a photoelectric conversion apparatus according to a first embodiment of the present invention. More specifically, FIG. 1A is the cross-section structure diagram showing a spread of a depletion layer in a case where a first voltage is applied, and FIG. 1B is the cross-section structure diagram showing a spread of the depletion layer in a case where a second voltage is applied. In FIG. 1A, a buried layer 16 of a second conductivity type (N type) is formed on a semiconductor substrate 17 of a first conductivity type (P type), and an N-type (Si) epitaxial layer 15 is further formed on the N-type buried layer 16. Here, the second conductivity type is opposite to the first conductivity type. A P well layer 14 is formed in the N-type epitaxial layer 15. Moreover, an N layer (N⁻ layer) 13 of which the impurity concentration is low, a P layer (P⁻ layer) 12 of which the impurity concentration is low, and an N layer (N⁺ layer) 11 which has a surface of which the impurity concentration is high are formed in the P well layer 14. That is, a photodiode which has longitudinal two layers of NPNPN is formed in a depth direction extending from the surface thereof, and the depths of the respective layers are suitable for photoelectric conversion of lights having different wavelength bands. Here, the junction depths of the respective layers may be appropriately designed according to the wavelength bands to be detected. In the present embodiment, the first conductivity is set as the P type, and the second conductivity is set as the N type. However, the present embodiment does not depend on the conductivity type in principle. Therefore, the first conductivity may be set as the N type, and the second conductivity may be set as the P type. Further, a voltage controlling unit 18 for controlling the voltage of the N⁻ layer 13 is provided, an electrode N1 for outputting an optical signal from the P⁻ layer 12 is provided, and an electrode N2 for outputting an optical signal from the P well layer 14 is provided. A plurality of switches 19 and serve as rest units for resetting the photodiode by applying a reset voltage Vdd to the plurality of photoelectric conversion regions 12 and 14 of the first conductivity type, respectively. The N-type epitaxial layer 15 and the surface N+ layer 11 are connected to each other by the wiring, and they are fixed to the constant voltage $V_{dd}$. The voltage controlling unit 18, which is connected to the N− layer 13, changes an amount of a reverse bias applied to a PN junction, by controlling the voltage of the N− layer 13, thereby changing a size of a depleted region. It should be note that the regions indicated by the arrows within the thick dotted lines are the depleted regions. That is, the P− layer 12 and the P well layer 14 are depleted when a first voltage V1 is applied, and the respective depleted regions are isolated from each other. As a result, each of the P− layer 12 and the P well layer 14 serves as the photodiode which uses holes as signal carriers. Here, the photodiode is the photoelectric conversion element for converting light into electrical signals. At this time, since the N− layer 13 is a neutral region, photocarriers generated in this region are discharged from the voltage controlling unit 18. As just described, when the first voltage V1 is applied, the holes mainly generated by short-wavelength light are collected in the P− layer 12 arranged at the shallow position. On the other hand, the holes generated by long-wavelength light are collected in the P well layer 14 arranged at the deep position.

In FIG. 1B, the voltage controlling unit 18 changes the amount of the reverse bias applied to the PN junction, by controlling the voltage of the N− layer 13 to a second voltage V2. It should be note that the region indicated by the arrow within the thick dotted lines is the depleted region. That is, when the second voltage V2 is applied, since the depletion layer of the P− layer 12 and the depletion layer of the P well layer 14 expand, these depletion layers are resultingly coupled with each other. For this reason, the photodiodes isolated when the first voltage was applied serve as one photodiode when the second voltage is applied. As just described, since the P− layer 12 and the P well layer 14 serve as the one photodiode, the holes generated by light of a wide wavelength band are collected. Here, when the constant voltage $V_{dd}$ is a positive power supply voltage, the second voltage V2 is lower than the first voltage V1, and the first voltage V1 is equivalent to, e.g., the constant voltage $V_{dd}$. Even in an equilibrium condition that the same voltage is being applied to both the ends of the PN junction, the depletion layer is formed in each of the P-type region and the N-type region by built-in potential. Here, when the thickness of the P− layer 12 and the P well layer 14 is smaller than the depth-direction length of the depletion layer formed by the built-in potential, the P− layer 12 and the P well layer 14 can be depleted even if the first voltage V1 is equivalent to the constant voltage $V_{dd}$. Incidentally, when the voltage controlling unit 18 applies the first voltage V1, the N− layer 13 is electrically isolated from the N-type epitaxial layer 15.

Figure 2B:
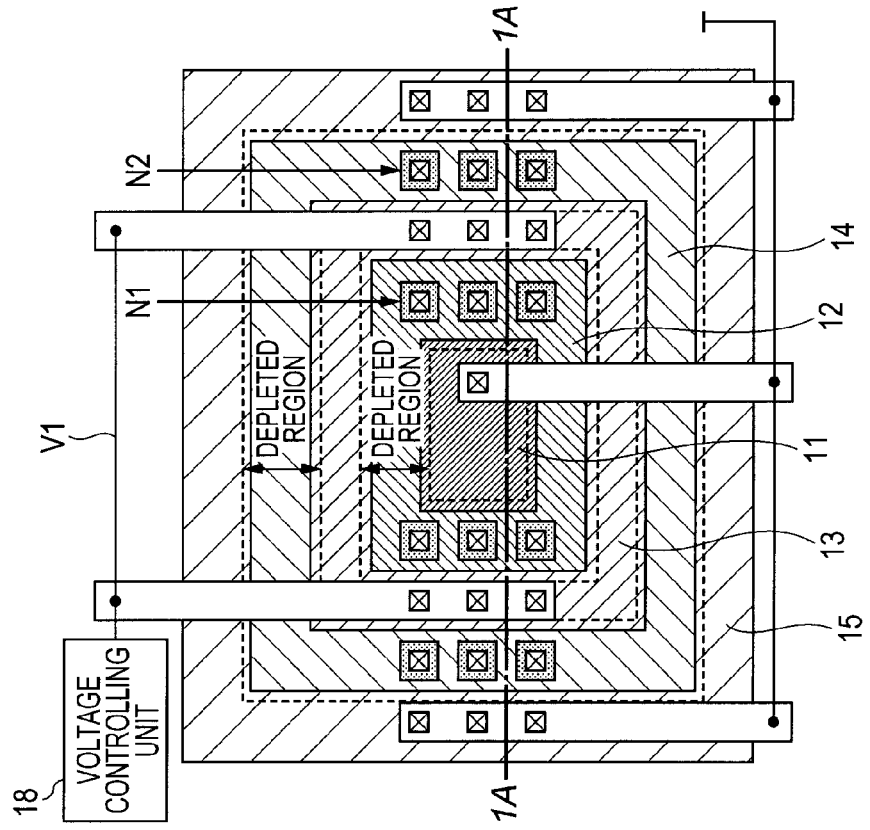

FIGS. 2A and 2B are planar structure diagrams of the photoelectric conversion apparatus according to the first embodiment of the present invention. FIG. 2A is the planar structure diagram showing the spread of the depletion layer in the case where the first voltage V1 is applied, and FIG. 2B is the planar structure diagram showing the spread of the depletion layer in the case where the second voltage V2 is applied. Here, the cross section along the line 1A-1A in FIG. 2A corresponds to FIG. 1A, the cross section along the line 1B-1B in FIG. 2B corresponds to FIG. 1B, and the parts in FIGS. 2A and 2B same as those in FIGS. 1A and 1B are indicated by the corresponding same reference numerals respectively. Although the semiconductor substrate 17 of the P type and the buried layer 16 of the N type respectively illustrated in FIGS. 1A and 1B are omitted in FIGS. 2A and 2B, the N+ layer 11, the P− layer 12, the N− layer 13, the P well layer 14 and the N-type epitaxial layer 15 are the same as those in FIGS. 1A and 1B and thus indicated by the corresponding same reference numerals respectively. Moreover, as well as FIGS. 1A and 1B, the N-type epitaxial layer 15 and the surface N+ layer 11 are connected to each other by the wiring, and they are fixed to the constant voltage. The voltage controlling unit 18, which is connected to the N− layer 13, changes the amount of the reverse bias applied to the PN junction, by controlling the voltage of the N− layer 13, whereby the regions indicated by the arrow zones within the thick dotted lines are depleted. Even in the planar structure illustrated in FIG. 2A, as well as FIG. 1A, the P− layer 12 and the P well layer 14, which are being depleted, are isolated by the N− layer 13 when the first voltage V1 is applied. On the other hand, even in the planar structure illustrated in FIG. 2B, as well as FIG. 1B, when the second voltage V2 is applied, since the depletion layer of the P− layer 12 and the depletion layer of the P well layer 14 expand, these depletion layers are resultingly coupled with each other. Incidentally, a plurality of contact plugs are connected to each of the N-type epitaxial layer 15, the P well layer 14, the N− layer 13 and the P− layer 12.

Figure 3A:
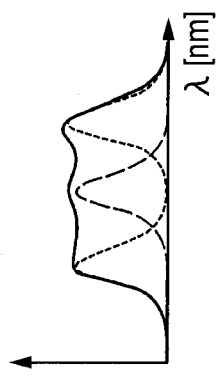
FIGS. 3A and 3B are diagrams illustrating spectral sensitivity characteristics of the photoelectric conversion apparatus according to the first embodiment of the present invention.
Figure 3B:
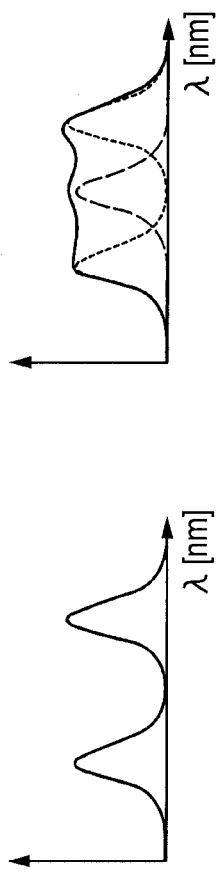

FIGS. 3A and 3B are diagrams illustrating spectral sensitivity characteristics of the photoelectric conversion apparatus according to the present embodiment. More specifically, FIG. 3A illustrates the spectral sensitivity characteristic to be obtained when the first voltage V1 is applied, and FIG. 3B illustrates the spectral sensitivity characteristic to be obtained when the second voltage V2 is applied. In FIG. 2A, since the P− layer 12 and the P well layer 14 are isolated from each other by the N− layer 13, the spectral sensitivity characteristic having the two kinds of wavelength bands is obtained. When the first voltage V1 is applied, since the light receiving wavelength region of the upper layer 12 of the first conductivity type and the lower layer 14 of the first conductivity type is divided into two regions by the neutral region of the layer 13 of the second conductivity type, it is possible to reduce a mixture of colors. On the other hand, in FIG. 2B, the depletion layer of the P− layer and the depletion layer of the P well layer 14 are coupled with each other since the N− layer 13 has been depleted. Consequently, the spectral sensitivity characteristic indicated by the dotted line and the spectral sensitivity characteristic indicated by the broken line between the left and right peaks of the spectral sensitivity characteristic indicated by the dotted line are added to each other, whereby the spectral sensitivity characteristic indicated by the solid line is resultingly obtained. When the second voltage V2 is applied, since the upper layer 12 of the first conductivity type and the lower layer 14 of the first conductivity type are conducted to each other by depleting the neutral region 13, it is possible to also detect the photocarriers in the neutral region 13. As a result, since it is possible to detect spectral characteristics of three or more colors, it is possible to improve sensitivity.

Figure 4:
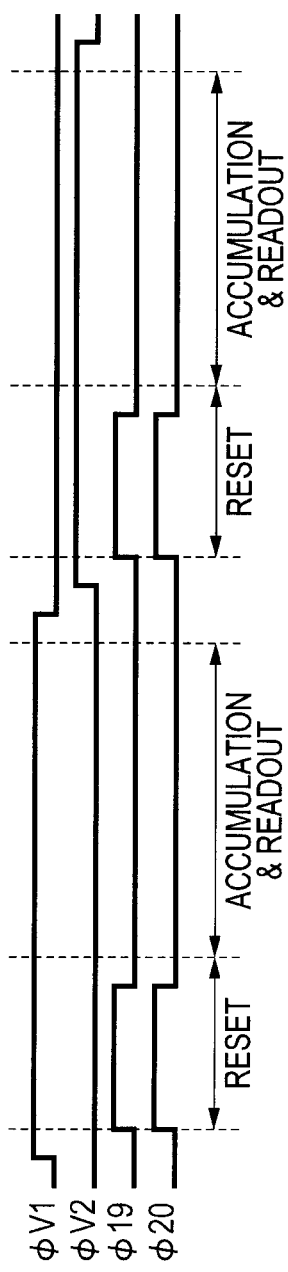
FIG. 4 is an operation timing chart of the photoelectric conversion apparatus according to the first embodiment of the present invention.

Here, an operation of the photoelectric conversion apparatus according to the present embodiment will be described with reference to FIG. 4. FIG. 4 shows a timing signal φV1 for applying the first voltage V1, a timing signal φV2 for applying the second voltage V2, a timing signal φ19 for turning on the switch 19, and a timing signal φ20 for turning on the switch 20. Initially, at the time when the first voltage V1 is applied by setting the timing signal φV1 to a high level, the P− layer 12 and the P well layer 14 are being electrically isolated from each other. For this reason, as a reset operation before accumulating photoinduced charges, the timing signal φ19 is set to a high level to turn on the switch 19, thereby resetting the P− layer 12. Likewise, the timing signal φ20 is set to a high level to turn on the switch 20, thereby resetting the P well layer 14. After then, in the accumulation operation of the photoinduced charges, the photocarriers generated in the P⁻ layer 12 and the P well layer 14 are photoelectrically converted, and then output and read respectively from the electrodes N1 and N2. Here, since the P⁻ layer 12 and the P well layer 14 are being isolated by the N⁻ layer 13, it is possible to obtain, in the light of the two kinds of wavelength bands, the optical signal in which a mixture of colors is extremely small.

Subsequently, a process of applying the second voltage V2 is performed. After the timing signal φV1 is set to a low level, the timing signal φV2 is set to a high level to apply the second voltage V2. In this case, as well as the process of applying the first voltage V1, before accumulating photoinduced charges, the timing signal φ19 is set to a high level to turn on the switch 19, thereby resetting the P⁻ layer 12 by applying the reset voltage $V_{dd}$. At the same time, the timing signal φ20 is set to a high level to turn on the switch 20, thereby resetting the P well layer 14 by applying the reset voltage $V_{dd}$. The depletion layer of the P⁻ layer 12 and the depletion layer of the P well layer 14 are coupled with each other by depleting the N⁻ layer 13. Consequently, since the volume of the depletion layer becomes large, the number of the carriers increases. At this time, when the switch 19 and the switch 20 are simultaneously turned on, the combined resistance of the two switches becomes small, whereby it is possible to shorten the time necessary for the reset operation. After then, in the accumulation operation, the photocarriers generated in the coupled depletion layers are photoelectrically converted, and then output and read respectively from the electrodes N1 and N2. Since the output optical signals enable to detect the photocarriers discarded in the N⁻ layer 13 when the first voltage V1 is applied, the wavelength band in which the photoelectric conversion is possible becomes wider. Thus, it is possible to detect the spectral characteristics of three or more colors, whereby it is possible to improve sensitivity.

As just described, by controlling the voltage controlling unit 18 in the time division manner, it is possible, when the first voltage V1 is applied, to obtain the optical signal in which there is no mixture of colors in the light of the two kinds of wavelength bands. Moreover, when the second voltage V2 is applied, the wavelength band becomes wider, whereby it is possible to detect the spectral characteristics of three or more colors. Thus, it is possible to improve sensitivity. In the present embodiment, the example that the operation at the time when the second voltage V2 is applied is performed subsequent to the operation at the time when the first voltage V1 is applied has been described. However, either one of these two kinds of operations may be performed consecutively. Moreover, either one of these two kinds of operations may be performed only once.

The photoelectric conversion apparatus according to the present embodiment has the structure that the photoelectric conversion regions 12 and 14 of the first conductivity type and the regions 11, 13 and 15 of the second conductivity type have been laminated alternately in the semiconductor substrate. The voltage controlling unit 18 changes the width of the depletion layer formed in the semiconductor substrate by controlling the voltage to be applied to the region 13 of the second conductivity type provided between the plurality of photoelectric conversion regions 12 and 14 of the first conductivity type. Further, the voltage controlling unit 18 forms the plurality of depletion layers corresponding to the plurality of photoelectric conversion regions 12 and 14 of the first conductivity type by applying the first voltage V1, and forms the one depletion layer for the plurality of photoelectric conversion regions 12 and 14 of the first conductivity type by applying the second voltage V2. Here, the second voltage V2 is the voltage different from the first voltage V1.

Second Embodiment

Figure 5A:
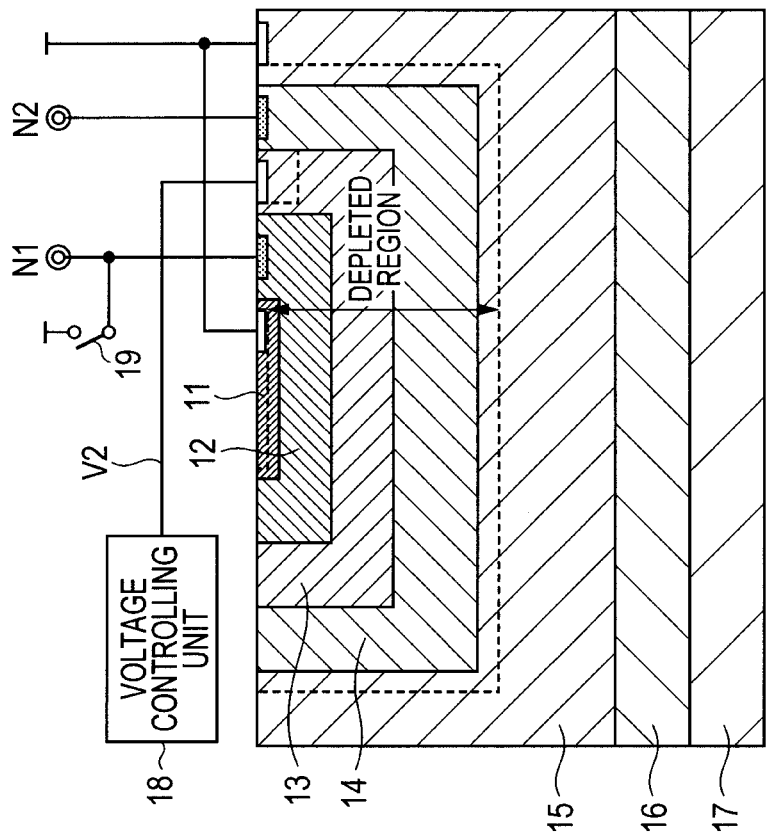
FIGS. 5A and 5B are cross-section structure diagrams of a photoelectric conversion apparatus according to a second embodiment of the present invention.
Figure 5B:
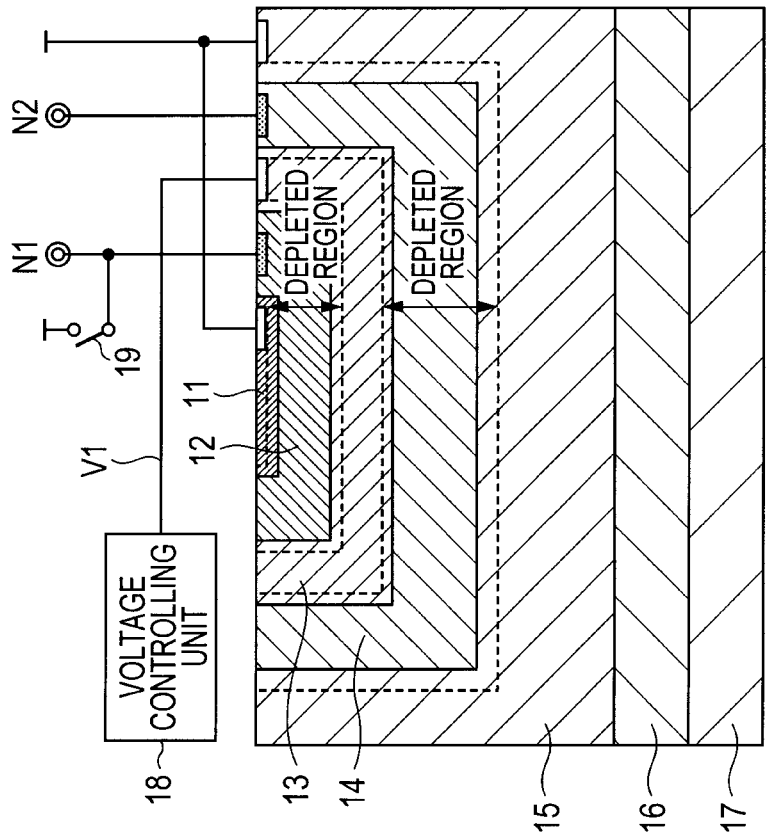
Figure 6:
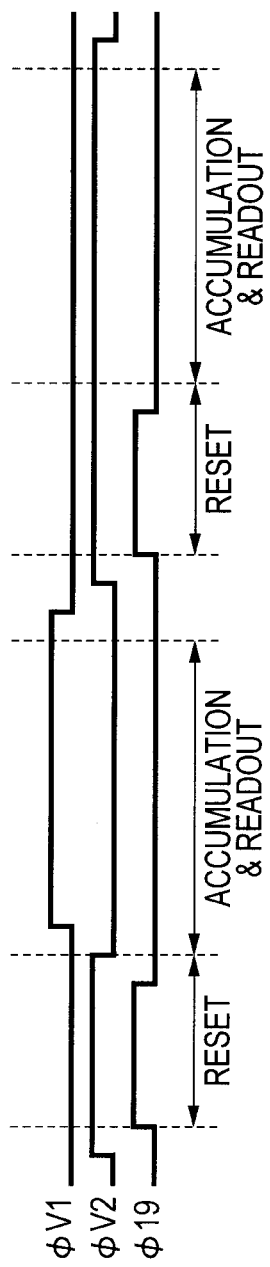
FIG. 6 is an operation timing chart of the photoelectric conversion apparatus according to the second embodiment of the present invention.

FIGS. 5A and 5B are cross-section structure diagrams of a photoelectric conversion apparatus according to a second embodiment of the present invention. More specifically, FIG. 5A is the cross-section structure diagram showing a spread of a depletion layer in a case where a first voltage V1 is applied, and FIG. 5B is the cross-section structure diagram showing a spread of the depletion layer in a case where a second voltage V2 is applied. Here, it should be noted that FIGS. 5A and 5B are respectively the same as FIGS. 1A and 1B except for the switch 20 for the reset operation is omitted from FIGS. 5A and 5B. A switch 19 is a rest unit for applying a reset voltage $V_{dd}$ to a semiconductor region 12 of a first conductivity type in a plurality of photoelectric conversion regions 12 and 14 of the first conductivity type. Hereinafter, a reset operation which is a difference from the first embodiment will be described with reference to FIG. 6. Here, timing signals φV1, φV2 and φ19 in FIG. 6 are the same as those in FIG. 4. Incidentally, a reset operation before accumulating photoinduced charges is performed as follows. That is, the timing signal φV2 is set to a high level, and the second voltage V2 is applied, thereby depleting an N⁻ layer 13. Thus, the depletion layer of the P⁻ layer 12 and the depletion layer of the P well layer 14 are conducted to each other. On that premise, the timing signal φ19 is set to a high level to turn on the switch 19, thereby applying a reset voltage $V_{dd}$ to the P⁻ layer 12. Thus, the depletion layer of the P⁻ layer 12, the depletion layer of the P well layer 14 and the depletion layer of the N⁻ layer 13 are reset. After then, the timing signal φV2 is set to a low level, and then the timing signal φV1 is set to a high level to apply the first voltage V1. Thus, the depletion layer of the P⁻ layer 12 and the depletion layer of the P well layer 14 are isolated from each other, and the accumulation operation is started. Here, an operation to be performed after the accumulation operation is the same as that in the first embodiment. Moreover, a next operation to be performed when, after the timing signal φV1 is set to a low level, the timing signal φV2 is next set to a high level to apply the second voltage V2 is the same as that in the first embodiment. As just described, since it is possible in the present embodiment to perform the reset operation by only the one switch 19, it is possible to reduce the number of elements as compared with the first embodiment. As a result, it is possible to reduce a chip area. As well as the first embodiment, the example that the operation at the time when the second voltage V2 is applied is performed subsequent to the operation at the time when the first voltage V1 is applied has been described in the present embodiment. However, either one of these two kinds of operations may be performed consecutively. Moreover, either one of these two kinds of operations may be performed only once.

Third Embodiment

Figure 7:
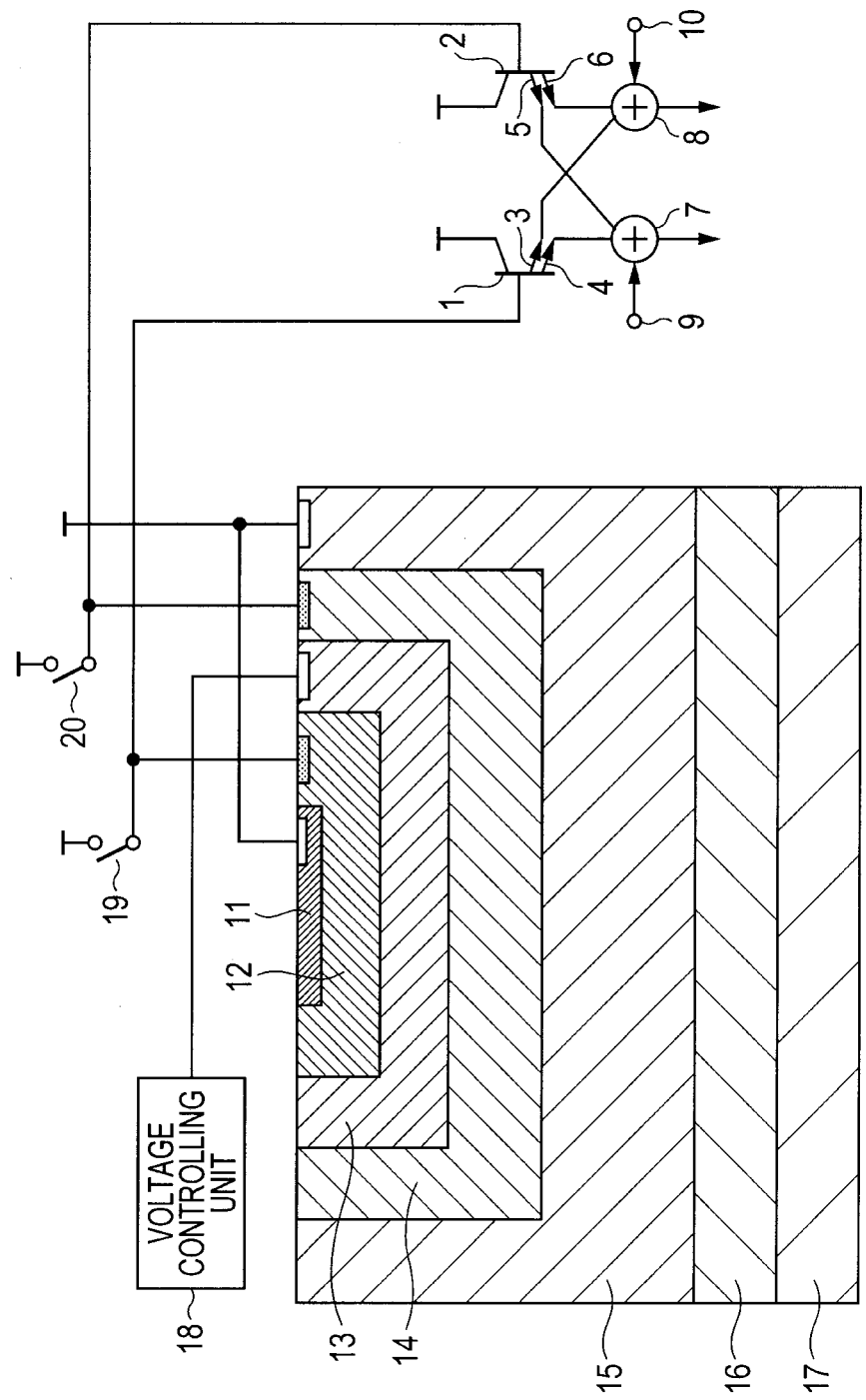
FIG. 7 is a cross-section structure diagram of a photoelectric conversion apparatus according to a third embodiment of the present invention.

FIG. 7 is a cross-section structure diagram of a photoelectric conversion apparatus according to a third embodiment of the present invention. In FIG. 7, each of current amplifiers 1 and 2 is constituted by a bipolar transistor, the base of the current amplifier 1 is connected to a P⁻ layer 12 of a photoelectric conversion unit, and the base of the current amplifier 2 is connected to a P well layer 14 of the photoelectric conversion unit. Further, the current amplifier 1 has emitters 3 and 4, and the current amplifier 2 has emitters 5 and 6.

Namely, each of the current amplifiers 1 and 2 has a multi-emitter structure. The current amplifier 1 amplifies a current input to the base thereof, and outputs the amplified current from the plurality of emitters 3 and 4. Likewise, the current amplifier 2 amplifies a current input to the base thereof, and outputs the amplified current from the plurality of emitters 5 and 6. The photocurrents output from the emitters 4 and 5 are added by a current adding unit 7, and then output. When a first control signal is input to an adding control unit 9, the current adding unit 7 adds the photocurrents from the emitters 4 and 5, and outputs the added photocurrents. On the other hand, when a second control signal is input to the adding control unit 9, the current adding unit 7 does not add the photocurrents from the emitters 4 and 5, and outputs only the photocurrents from the emitter 4. Besides, when the first control signal is input to an adding control unit 10, a current adding unit 8 adds the photocurrents from the emitters 3 and 6, and outputs the added photocurrents. On the other hand, when the second control signal is input to the adding control unit 10, the current adding unit 8 does not add the photocurrents from the emitters 3 and 6, and outputs only the photocurrents from the emitter 6.

Figure 8:
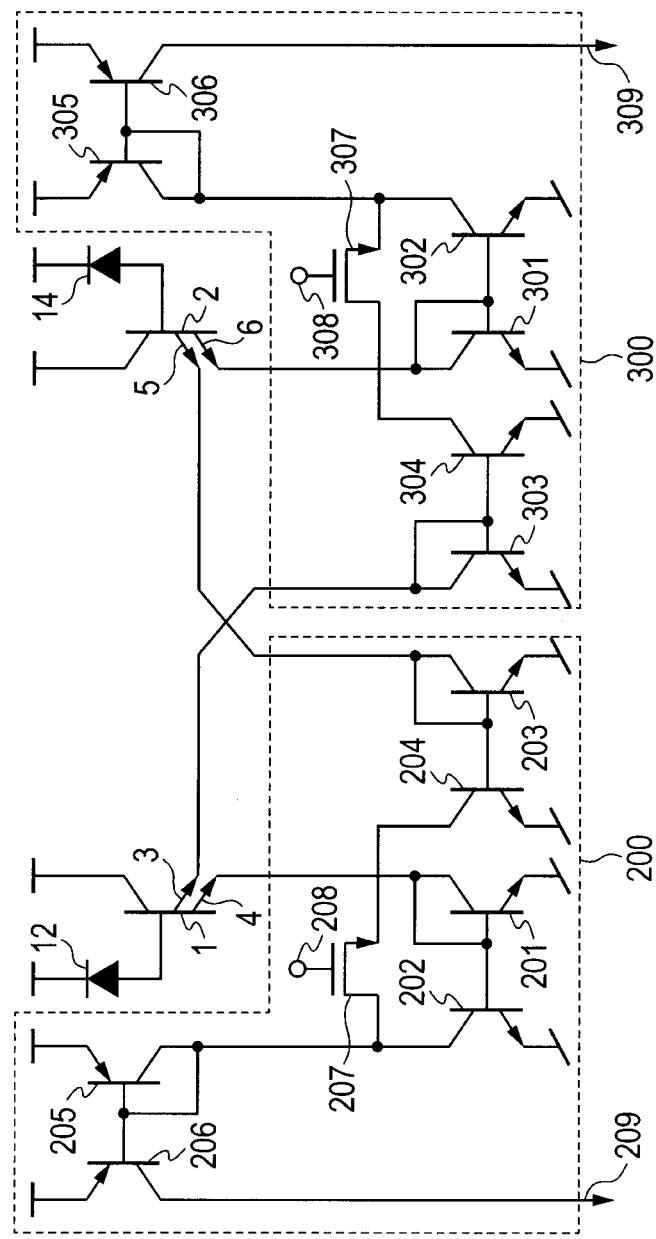
FIG. 8 is a diagram illustrating a circuit configuration of a current adding unit according to the third embodiment of the present invention.

FIG. 8 is a diagram illustrating concrete circuit configurations of the current adding units 7 and 8. It should be noted that, in FIG. 8, circuit elements 1 to 6, 12 and 14 are the same as those in FIGS. 5 and 7. In FIG. 8, a current adding unit 200, which is equivalent to the current adding unit 7, is constituted by bipolar transistors 201, 202, 203, 204, 205 and 206. Here, the bipolar transistors 201 and 202 and the bipolar transistors 203 and 204 constitute current mirror circuits, respectively. Optical signals output from the emitters 4 and 5 are added to each other by a current mirror circuit constituted by the bipolar transistors 205 and 206, through the respective current mirror circuits, and the added optical signal is output from a terminal 209. An N-type MOS (metal oxide semiconductor) transistor 207 corresponds to the adding control unit 9. When a terminal 208 is being set to a high level, the added optical signal is sent to the terminal 209. On the other hand, when the terminal 208 is being set to a low level, the optical signal input from the emitter 4 is not added to the optical signal input from the emitter 5, and is directly sent to the terminal 209. Likewise, a current adding unit 300, which is equivalent to the current adding unit 8, is constituted by bipolar transistors 301, 302, 303, 304, 305 and 306. An N-type MOS transistor 307 corresponds to the adding control unit 10. When a terminal 308 is being set to a high level, the optical signals input from the emitters 3 and 6 are added to each other and sent to a terminal 309. On the other hand, when the terminal 308 is set to a low level, the optical signal input from the emitter 6 is not added to the optical signal input from the emitter 3, and is directly sent to the terminal 309.

In the present embodiment as described in FIGS. 7 and 8, it is possible to simultaneously obtain the optical signal and the added optical signal of the P⁻ layer 12 and the P well layer 14 of the photoelectric conversion unit, according to combinations of the signals given to the adding control units 9 and 10. That is, when the first voltage V1 is applied, the terminals 208 and 308 are set to the low level, whereby it is possible to obtain, as the optical signal not to be added, the optical signal in which there is no mixture of colors. In addition, when the second voltage V2 is applied, the terminals 208 and 308 are set to the high level, whereby it is possible to improve sensitivity by, as the added optical signal, the optical signal which includes the spectral characteristics of three or more colors having the widened wavelength bands.

Fourth Embodiment

Figure 9:
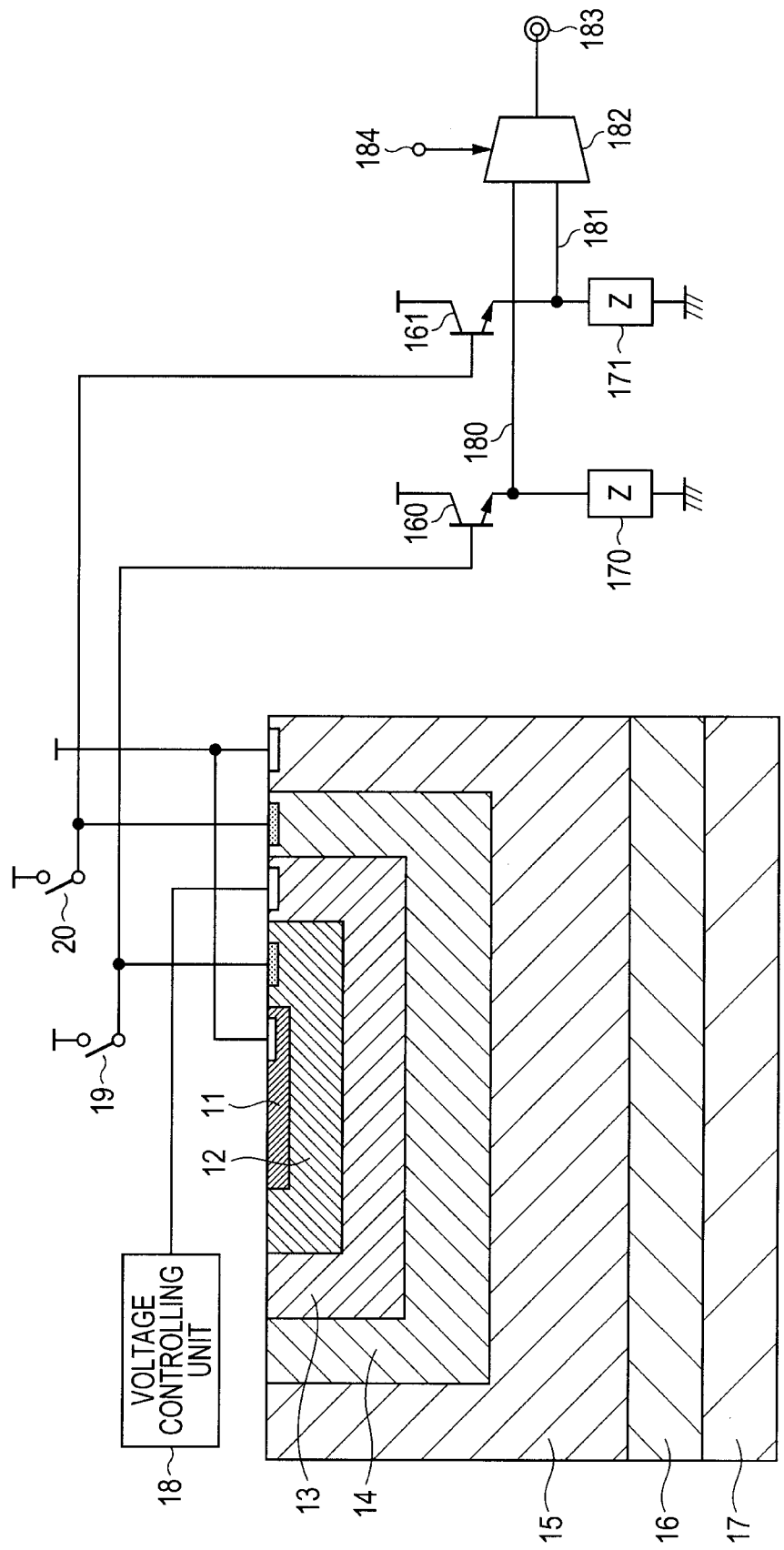
FIG. 9 is a cross-section structure diagram of a photoelectric conversion apparatus according to a fourth embodiment of the present invention.

FIG. 9 is a cross-section structure diagram of a photoelectric conversion apparatus according to a fourth embodiment of the present invention. It should be noted that the present embodiment is characterized by a circuit configuration for amplifying an output current. In FIG. 9, an N⁺ layer 11, a P⁻ layer 12, an N⁻ layer 13, a P well layer 14, an N-type epitaxial layer 15, an N-type buried layer 16, a semiconductor substrate 17, a voltage controlling unit 18, and switches 19 and 20 are the same as those in the first to third embodiments. Therefore, descriptions of constitutions and functions of these parts will be omitted.

In FIG. 9, each of current amplifiers 160 and 161 is constituted by a bipolar transistor, the base of the current amplifier 160 is connected to the P⁻ layer 12 of a photoelectric conversion unit, and the base of the current amplifier 161 is connected to the P well layer 14 of the photoelectric conversion unit. Further, the collector of each of the current amplifiers 160 and 161 is connected to the wiring for supplying a power-supply voltage. Furthermore, a load 170 and an output line 180 are connected to the emitter of the current amplifier 160, and a load 171 and an output line 181 are connected to the emitter of the current amplifier 161. A photocurrent generated in photoelectric conversion is amplified by the current amplifier 160 or 161, subjected to voltage conversion by the load 170 or 171, and output as a signal from the output line 180 or 181.

A voltage adding unit 182 is provided. The signals respectively output to the output lines 180 and 181 are added to each other by the voltage adding unit 182, and the added signal is output from an output terminal 183. Further, an adding control unit 184 is provided. It is controlled, based on a signal input to the adding control unit 184, that the voltage adding unit 182 adds the signals from the output lines 180 and 181 to each other and outputs the added signal, or the voltage adding unit 182 outputs only the signal from either one of the signal lines 180 and 181 without adding them.

According to the present embodiment in FIG. 9, it is possible, by the signal given to the adding control unit 184, to obtain the respective signals of the P⁻ layer 12 and the P well layer 14 of the photoelectric conversion unit, and the signal obtained by adding these signals to each other. More specifically, when the first voltage is applied, it is possible to obtain, as the signal not to be added, the optical signal in which there is no mixture of colors. In addition, when the second voltage is applied, it is possible to improve sensitivity by, as the added signal, the optical signal which includes the spectral characteristics of three or more colors having the widened wavelength bands.

Fifth Embodiment

Figure 10:
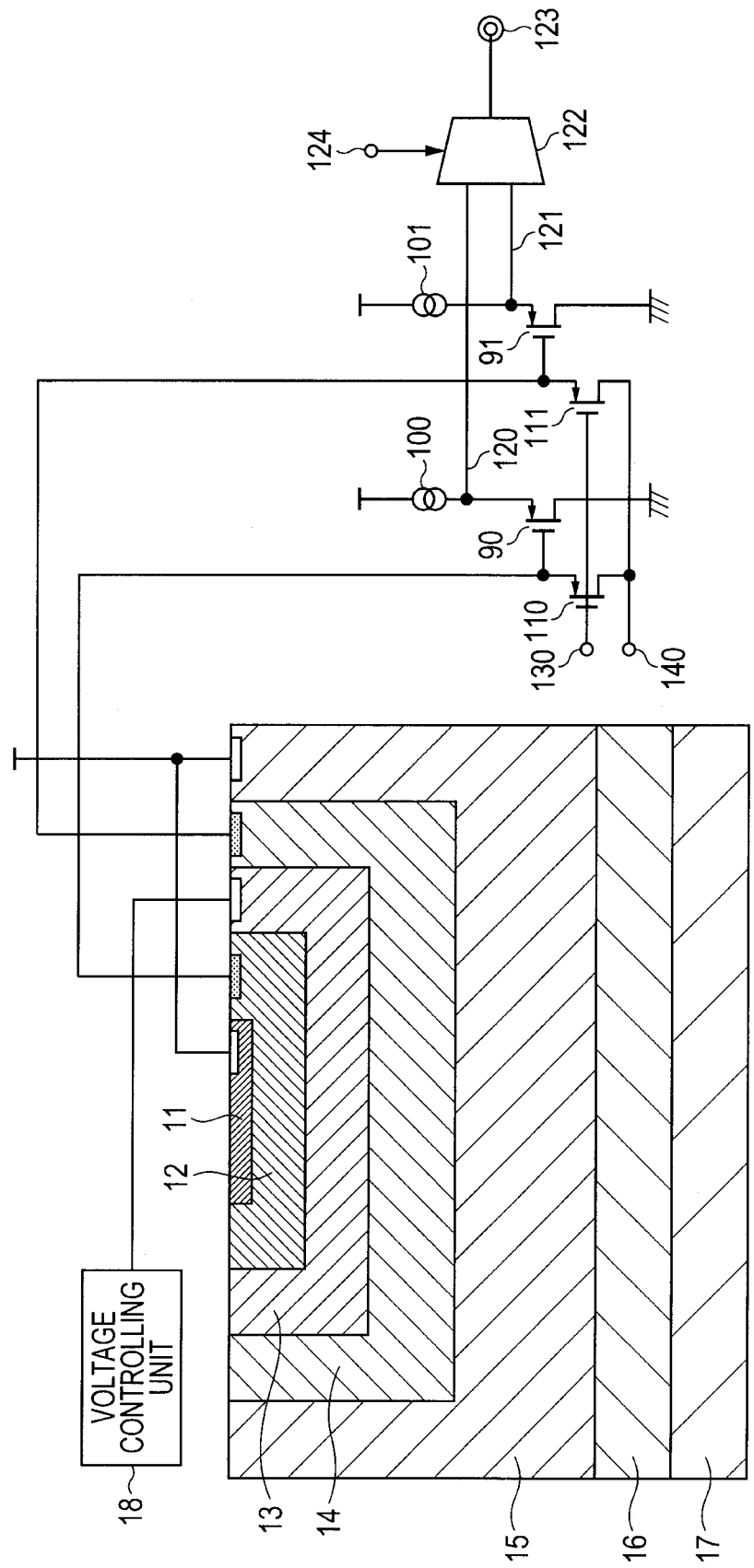
FIG. 10 is a cross-section structure diagram of a photoelectric conversion apparatus according to a fifth embodiment of the present invention.

FIG. 10 is a cross-section structure diagram of a photoelectric conversion apparatus according to a fifth embodiment of the present invention. It should be noted that the present embodiment is characterized by a circuit configuration for amplifying an output current. In FIG. 10, an N⁺ layer 11, a P⁻ layer 12, an N⁻ layer 13, a P well layer 14, an N-type epitaxial layer 15, an N-type buried layer 16, a semiconductor substrate 17, and a voltage controlling unit 18 are the same as those in the first to fourth embodiments. Therefore, descriptions of constitutions and functions of these parts will be omitted.

In FIG. 10, the gate of a P-type MOS transistor is connected to the P⁻ layer 12 of a photoelectric conversion unit, and the gate of a P-type MOS transistor 91 is connected to the P well layer 14 of the photoelectric conversion unit. Further, a current source 100 and an output line 120 are connected to the source of the P-type MOS transistor 90, and a current source 101 and an output line 121 are connected to the source of the P-type MOS transistor 91. The P-type MOS transistors 90 and 91 constitute source followers with the current sources 100 and 101, respectively. A reset signal 130 is supplied to the gates of P-type MOS transistors 110 and 111, and the drains of the respective P-type MOS transistors 110 and 111 are connected to a node 140 of supplying a reset voltage.

In the photoelectric conversion apparatus according to the present embodiment, the P-type MOS transistors 110 and 111 are first turned on (set to a conduction state) to initialize the respective voltages of the P$^-$ layer 12 and the P well layer 14 to the reset voltage. After then, the P-type MOS transistors 110 and 111 are turned off (set to a non-conduction state), whereby the voltage conversions to the signal charges obtained by the photoelectric conversions from the P$^-$ layer 12 and the P well layer 14 are performed with the capacities attached to the gate terminals of the P-type MOS transistors 90 and 91. Then, the obtained signal voltages are read from the respective output lines 120 and 121. Incidentally, a transfer transistor for transferring the charges and a floating diffusion unit to which the charges are transferred may be arranged on an electrical channel between the P$^-$ layer 12 and the P-type MOS transistors 90. Furthermore, a transfer transistor for transferring the charges and a floating diffusion unit to which the charges are transferred may be arranged on an electrical channel between the P well layer 14 and the P-type MOS transistors 91.

A voltage adding unit 122 is provided. The signals respectively output to the output lines 120 and 121 are added to each other by the voltage adding unit 122, and the added signal is output from an output terminal 123. Further, an adding control unit 124 is provided. It is controlled, based on a signal input to the adding control unit 124, that the voltage adding unit 122 adds the signals from the output lines 120 and 121 to each other and outputs the added signal, or the voltage adding unit 122 outputs only the signal from either one of the signal lines 120 and 121 without adding them.

According to the present embodiment in FIG. 10, it is possible, by the signal given to the adding control unit 124, to obtain the optical signals and the added optical signal of the P$^-$ layer 12 and the P well layer 14 of the photoelectric conversion unit. More specifically, when the first voltage is applied, it is possible to obtain, as the signal not to be added, the optical signal in which there is no mixture of colors. In addition, when the second voltage is applied, it is possible to improve sensitivity by, as the added optical signal, the optical signal which includes the spectral characteristics of three or more colors having the widened wavelength bands.

Incidentally, it should be noted that the above-described embodiments merely indicate the specific examples for carrying out the present invention and that the technical scope of the present invention should not be restrictively interpreted due to these embodiments. Also, it should be noted that embodiments obtained by properly combining the features of the above-described first to fifth embodiments are included in the present invention. That is, the present invention can be implemented in various forms without departing from the technical idea or the main features of the present invention.

This application claims the benefit of Japanese Patent Applications No. 2011-018793, filed Jan. 31, 2011, and No. 2011-251657, filed Nov. 17, 2011, which are hereby incorporated by reference herein in their entirety.

What is claimed is:

1. A photoelectric conversion apparatus comprising:
    a plurality of photoelectric conversion regions of a first conductivity type; and
    a plurality of semiconductor regions of a second conductivity type opposite to the first conductivity type,
    wherein the plurality of photoelectric conversion regions of the first conductivity type and the plurality of semiconductor regions are alternately arranged along a depth direction, and
    the photoelectric conversion apparatus further comprises a voltage controlling unit configured to change a width of a depletion layer formed in a semiconductor substrate, by controlling a voltage to be applied to the semiconductor region of the second conductivity type provided between the plurality of photoelectric conversion regions of the first conductivity type.

2. The photoelectric conversion apparatus according to claim 1, wherein the voltage controlling unit is configured to apply a first voltage so as to form the plurality of depletion layers corresponding to the plurality of photoelectric conversion regions of the first conductivity type, and is configured to apply a second voltage different from the first voltage so as to form the one depletion layer for the plurality of photoelectric conversion regions of the first conductivity type.

3. The photoelectric conversion apparatus according to claim 1, further comprising a plurality of reset units each configured to apply a reset voltage to each of the plurality of photoelectric conversion regions of the first conductivity type.

4. The photoelectric conversion apparatus according to claim 2, further comprising a plurality of reset units each configured to apply a reset voltage to each of the plurality of photoelectric conversion regions of the first conductivity type,
    wherein the plurality of reset units simultaneously apply the reset voltages to the plurality of photoelectric conversion regions of the first conductivity type when the voltage controlling unit is applying the second voltage.

5. The photoelectric conversion apparatus according to claim 2, further comprising one reset unit configured to apply a reset voltage to one of the plurality of photoelectric conversion regions of the first conductivity type,
    wherein the reset unit applies the reset voltage to the one of the plurality of photoelectric conversion regions of the first conductivity type when the voltage controlling unit is applying the second voltage.

6. The photoelectric conversion apparatus according to claim 1, further comprising:
    a plurality of bipolar transistors, a base of each of which is connected to each of the plurality of photoelectric conversion regions of the first conductivity type, each configured to amplify a current input to the base and output the amplified current from a plurality of emitters; and
    a current adding unit configured to add and output the currents output from the emitters of the plurality of bipolar transistors in a case where a first control signal is input, and separately output the currents output from the emitters of the plurality of bipolar transistors in a case where a second control signal is input.

7. The photoelectric conversion apparatus according to claim 2, further comprising:
    a plurality of bipolar transistors, a base of each of which is connected to each of the plurality of photoelectric conversion regions of the first conductivity type, each configured to amplify a current input to the base and output the amplified current from a plurality of emitters; and
    a current adding unit configured to add and output the currents output from the emitters of the plurality of bipolar transistors in a case where the voltage controlling unit applies the second voltage, and separately output the currents output from the emitters of the plurality of bipolar transistors in a case where the voltage controlling unit applies the first voltage.

8. The photoelectric conversion apparatus according to claim 1, further comprising:
a plurality of bipolar transistors, a base of each of which is connected to each of the plurality of photoelectric conversion regions of the first conductivity type, each configured to amplify a current input to the base and output the amplified current from an emitter; and
a current adding unit configured to add and output the currents output from the emitters of the plurality of bipolar transistors in a case where a first control signal is input, and separately output the currents output from the emitters of the plurality of bipolar transistors in a case where a second control signal is input.

9. The photoelectric conversion apparatus according to claim 2, further comprising:
a plurality of bipolar transistors, a base of each of which is connected to each of the plurality of photoelectric conversion regions of the first conductivity type, each configured to amplify a current input to the base and output the amplified current from an emitter; and
a current adding unit configured to add and output the currents output from the emitters of the plurality of bipolar transistors in a case where the voltage controlling unit applies the second voltage, and separately output the currents output from the emitters of the plurality of bipolar transistors in a case where the voltage controlling unit applies the first voltage.

10. The photoelectric conversion apparatus according to claim 1, further comprising:
a plurality of MOS (metal oxide semiconductor) transistors, a gate of each of which is connected to each of the plurality of photoelectric conversion regions of the first conductivity type, each configured to output a signal according to a voltage input to the gate; and
a current adding unit configured to add and output the signals output from the plurality of MOS transistors in a case where a first control signal is input, and separately output the signals output from the plurality of MOS transistors in a case where a second control signal is input.

11. The photoelectric conversion apparatus according to claim 2, further comprising:
a plurality of MOS transistors, a gate of each of which is connected to each of the plurality of photoelectric conversion regions of the first conductivity type, each configured to output a signal according to a voltage input to the gate; and
a current adding unit configured to add and output the signals output from the plurality of MOS transistors in a case where the voltage controlling unit applies the second voltage, and separately output the signals output from the plurality of MOS transistors in a case where the voltage controlling unit applies the first voltage.

12. The photoelectric conversion apparatus according to claim 2, wherein, in a case where the voltage controlling unit applies the first voltage, the plurality of photoelectric conversion regions of the first conductivity type are electrically isolated by the semiconductor region of the second conductivity type.

13. The photoelectric conversion apparatus according to claim 1, wherein the plurality of semiconductor regions of the second conductivity type are electrically isolated by one of the plurality of photoelectric conversion regions of the first conductivity type.

14. The photoelectric conversion apparatus according to claim 2, wherein, in a case where the voltage controlling unit applies the first voltage, the semiconductor region of the second conductivity type arranged between the plurality of photoelectric conversion regions of the first conductivity type is electrically isolated from another semiconductor region of the second conductivity type.

15. The photoelectric conversion apparatus according to claim 1, further comprising:
at least one reset unit configured to apply a reset voltage to each of the plurality of photoelectric conversion regions of the first conductivity type; and
a plurality of transistors configured to output signals from the plurality of photoelectric conversion regions of the first conductivity type,
wherein a plurality of contact plugs are connected to each of the plurality of photoelectric conversion regions of the first conductivity type,
the semiconductor region of the second conductivity type arranged between the plurality of photoelectric conversion regions of the first conductivity type is connected to the voltage controlling unit through the plurality of contact plugs,
each of the plurality of photoelectric conversion regions of the first conductivity type is connected to the transistor through the plurality of contact plugs,
at least one of the plurality of photoelectric conversion regions of the first conductivity type is connected to at least the one reset unit through the plurality of contact plugs, and
the voltage controlling unit is configured to apply a first voltage so as to form the plurality of depletion layers corresponding to the plurality of photoelectric conversion regions of the first conductivity type, and is configured to apply a second voltage different from the first voltage so as to form the one depletion layer for the plurality of photoelectric conversion regions of the first conductivity type.

16. The photoelectric conversion apparatus according to claim 15, wherein
one of the plurality of photoelectric conversion regions of the first conductivity type is connected at least the one reset unit through the plurality of contact plugs, and
the other one of the plurality of photoelectric conversion regions of the first conductivity type is connected to at least the one reset unit through the one of the plurality of photoelectric conversion regions of the first conductivity type.

* * * * *